United States Patent
Park et al.

[11] Patent Number: 6,001,660
[45] Date of Patent: Dec. 14, 1999

[54] METHODS OF FORMING INTEGRATED CIRCUIT CAPACITORS USING METAL REFLOW TECHNIQUES

[75] Inventors: Young-soh Park; Sang-in Lee; Cheol-seong Hwang; Doo-sup Hwang, all of Kyungki-do; Hag-Ju Cho, Seoul, all of Rep. of Korea

[73] Assignee: Samsung Electronics Co., Ltd., Rep. of Korea

[21] Appl. No.: 08/969,672

[22] Filed: Nov. 13, 1997

[30] Foreign Application Priority Data

Apr. 17, 1997 [KR] Rep. of Korea ............... 97-14195

[51] Int. Cl.⁶ ....................................... H01G 7/06
[52] U.S. Cl. ................................. 438/3; 438/632
[58] Field of Search .................... 438/3, 618–685

[56] References Cited

U.S. PATENT DOCUMENTS

| | | | |
|---|---|---|---|
| 536,920 | 11/1895 | Yamamichi et al. | 437/52 |
| 4,348,263 | 9/1982 | Draper et al. | 204/29 |
| 4,466,177 | 8/1984 | Chao | 29/571 |
| 5,019,535 | 5/1991 | Wojnarowski et al. | 437/209 |
| 5,066,615 | 11/1991 | Brady et al. | 437/229 |
| 5,074,969 | 12/1991 | Brewer et al. | 205/118 |
| 5,122,477 | 6/1992 | Wolters et al. | 437/60 |
| 5,173,170 | 12/1992 | Brown et al. | 205/96 |
| 5,281,549 | 1/1994 | Fazan et al. | 437/52 |
| 5,335,138 | 8/1994 | Sandhu et al. | 361/303 |
| 5,372,974 | 12/1994 | Doan et al. | |
| 5,392,189 | 2/1995 | Fazan et al. | 361/305 |
| 5,464,786 | 11/1995 | Figura et al. | 437/52 |
| 5,478,772 | 12/1995 | Fazan | 437/60 |
| 5,504,041 | 4/1996 | Summerfelt | 437/235 |
| 5,563,762 | 10/1996 | Leung et al. | 361/301 |
| 5,629,236 | 5/1997 | Wada et al. | |
| 5,686,760 | 11/1997 | Miyakawa. | |
| 5,696,015 | 12/1997 | Hwang | 437/52 |

FOREIGN PATENT DOCUMENTS

| | | |
|---|---|---|
| 0 697 717 | 2/1996 | European Pat. Off. |
| WO96/17381 | 6/1996 | WIPO . |

OTHER PUBLICATIONS

Hiromi Itoh et al., Integration of BST Thin Film for DRAM Fabrication, Integrated Ferroelectrics, 1995, vol. 11, pp. 101–109.

*Primary Examiner*—Jey Tsai
*Attorney, Agent, or Firm*—Myers Bigel Sibley & Sajovec

[57] ABSTRACT

Methods of forming integrated circuit capacitors include the steps of forming an electrically insulating layer on a face of a semiconductor substrate and then patterning the electrically insulating layer to define a contact hole therein. A barrier metal layer is then formed in at least a portion of the contact hole. A lower electrode metal layer is then formed on the barrier metal layer and then planarized by reflowing the lower electrode metal layer at a temperature greater than about 650° C. in a nitrogen gas ambient, to define a lower capacitor electrode. A layer of material having a high dielectric constant is then formed on the lower capacitor electrode. An upper capacitor electrode is then formed on the dielectric layer, opposite the lower capacitor electrode. The dielectric layer may comprise $Ba(Sr, Ti)O_3$, $Pb(Zr, Ti)O_3$, $Ta_2O_5$, $SiO_2$, $SiN_3$, $SrTiO_3$, PZT, $SrBi_2Ta_2O_9$, $(Pb, La)(Zr, Ti)O_3$ and $Bi_4Ti_3O_{12}$. According to one embodiment of the present invention, the step of patterning the electrically insulating layer comprises patterning the electrically insulating layer to define a contact hole therein that exposes the face of the semiconductor substrate. The step of forming a barrier metal layer also preferably comprises depositing a conformal barrier metal layer on sidewalls of the contact hole and on the exposed face of the substrate. The barrier metal layer may be selected from the group consisting of TiN, CoSi, TaSiN, TiSiN, TaSi, TiSi, Ta and TaN.

17 Claims, 14 Drawing Sheets

METHODS OF FORMING INTEGRATED CIRCUIT CAPACITORS USING METAL REFLOW TECHNIQUES

CROSS-REFERENCE TO RELATED APPLICATIONS

This application is related to application Ser. No. 08/969,803 entitled METHODS OF FORMING CAPACITOR ELECTRODES HAVING REDUCED SUSCEPTIBILITY TO OXIDATION AND CAPACITOR ELECTRODES FORMED THEREBY (Attorney Docket No. 5649-393) and application Ser. No. 08/969,395, now U.S. Pat. No. 5,877,062, entitled METHODS OF FORMING INTEGRATED CIRCUIT CAPACITORS HAVING PROTECTED DIFFUSION BARRIER METAL LAYERS THEREIN (Attorney Docket No. 5649-421), filed concurrently herewith, the disclosures of which are hereby incorporated herein by reference.

FIELD OF THE INVENTION

The present invention relates to methods of forming integrated circuits, and more particularly to methods of forming capacitors for integrated circuits.

BACKGROUND OF THE INVENTION

Reductions in cell capacitance due to reductions in memory cell area impede the progress towards higher integration of memory devices, and make it more difficult to secure desired cell capacitance using typical dielectric materials such as nitride/oxide (NO) and tantalum pentoxide $Ta_2O_5$. Therefore, research into methods for forming dielectric layers of capacitors using high dielectric materials such as $Ba(Sr,Ti)O_3$ (BST) or $Pb(Zr,Ti)O_3$ (PZT), has been conducted. At this time, it is also well known that metals of the platinum group (or an oxide thereof) have excellent oxidation resistance and relatively low inter-diffusibility with BST or PZT thin films and are suitable for use as capacitor electrode materials.

FIGS. 1A and 1B are sectional views for illustrating a conventional method for forming a capacitor storage electrode using platinum. Referring to FIG. 1A, an insulating layer 12 formed on a semiconductor substrate 10 is partially etched to form a storage contact hole 14, and then polysilicon is deposited and etched back to form a conductive plug 16 for filling the storage contact hole 14. A titanium nitride layer 18 (as a barrier layer) is then formed on the resultant structure where the conductive plug 16 is formed, and platinum is deposited on the titanium nitride layer 18 to form a platinum layer 20. Then, an oxide layer to be used as an etching mask is formed on the resultant structure where the platinum layer 20 is formed, and patterned to form a mask pattern 22.

Referring to FIG. 1B, using the mask pattern 22 as an etching mask, the platinum layer 20 and the titanium nitride layer 18 are sequentially etched to form a platinum layer pattern 24 and a barrier layer pattern 26 which collectively form a storage electrode 27. After removing the mask pattern 22, a dielectric layer 28 formed of BST or PZT is deposited as a blanket layer using a sputtering method or a metal organic chemical vapor deposition (MOCVD) method. Then, a plate electrode 30 is formed on the dielectric layer 28, opposite the storage electrode 27.

However, when forming a capacitor using a high dielectric material such as BST or PZT as described above, problems may occur. First, during the step of forming the dielectric layer 28, diffusion of oxygen through the side surfaces of an exposed barrier layer 26 may deteriorate the electrical characteristics of the capacitor. In particular, the oxygen atmosphere and the high temperature at which the high dielectric layer 28 (such as BST or PZT) is typically formed, accelerate the rate of oxygen diffusion into the barrier layer 28. Due to oxygen diffusion, the barrier layer pattern 26 may be partially oxidized, and a titanium oxide layer $TiO_2$ (not shown) which has an insulating characteristic may be formed on an interface between the conductive plug 16 and the barrier layer pattern 26, or between the barrier layer pattern 26 and the platinum layer pattern 24. A discussion of these adverse consequences of oxygen diffusion is also provided in U.S. Pat. No. 5,478,772 to Fazan.

As will be understood by those skilled in the art, the titanium oxide layer may cause contact failure between the barrier layer pattern 26 and the platinum layer pattern 24. Also, the titanium oxide layer deteriorates the function of the barrier layer 26 in preventing diffusion of oxygen or metal atoms therethrough, and may cause generation of leakage currents between the storage electrode and the semiconductor substrate. Second, since the storage electrode including the platinum layer pattern 24 is required to be thickly formed, the titanium oxide layer may impede patterning and may generate a high step difference adjacent the capacitor. Alternatively, if the platinum layer pattern 24 of the storage electrode is thin, then oxygen may readily pass through the platinum layer pattern 24 to combine with the barrier layer pattern 26. Accordingly, the platinum layer pattern 24 is typically made to be about 2000 Å thick or more. However, since platinum is very hard and refractory, it typically 2 0 cannot be easily etched through dry etching such as reactive ion etching. Accordingly, when the platinum layer pattern is 2000 Å thick or more, patterning becomes very difficult and the platinum layer pattern 24 may create a large step difference around the capacitor. Third, it is typically difficult to secure an etching mask comprising a material that can be selectively etched at a much lower rate than platinum. This latter difficulty is further compounded when thick platinum layer patterns 24 are used.

SUMMARY OF THE INVENTION

It is therefore an object of the present invention to provide improved methods of forming integrated circuit capacitors.

It is another object of the present invention to provide methods of forming integrated circuit capacitors with reduced susceptibility to parasitic oxidation of protective barrier layers therein.

It is still another object of the present invention to provide methods of forming integrated circuit capacitors that are compatible with the use of refractory metal electrodes.

These and other objects, advantages and features of the present invention are provided by methods of forming integrated circuit capacitors which include the steps of forming an electrically insulating layer on a face of a semiconductor substrate and then patterning the electrically insulating layer to define a contact hole therein. A barrier metal layer is then formed in at least a portion of the contact hole. A lower electrode metal layer is then formed on the barrier metal layer and then planarized by reflowing the lower electrode metal layer at a temperature greater than about 650° C. in a nitrogen gas ambient, to define a lower capacitor electrode. The lower electrode metal layer may comprise platinum or another refractory metal. A layer of material having a high dielectric constant is then formed on the lower capacitor electrode. An upper capacitor electrode is then formed on the dielectric layer, opposite the lower capacitor electrode. The dielectric layer may comprise Ba(Sr, Ti)O$_3$, Pb(Zr, Ti)O$_3$, Ta$_2$O$_5$, SiO$_2$, SiN$_3$, SrTiO$_3$, PZT, SrBi$_2$Ta$_2$O$_9$, (Pb, La) (Zr, Ti)O$_3$ and Bi$_4$Ti$_3$O$_{12}$.

According to one embodiment of the present invention, the step of patterning the electrically insulating layer comprises patterning the electrically insulating layer to define a contact hole therein that exposes the face of the semiconductor substrate. The step of forming a barrier metal layer also preferably comprises depositing a conformal barrier metal layer on sidewalls of the contact hole and on the exposed face of the substrate. The barrier metal layer is also preferably selected from the group consisting of TiN, CoSi, TaSiN, TiSiN, TaSi, TiSi, Ta and TaN. According to another embodiment of the present invention, the step of forming a barrier metal is preceded by the step of forming a polysilicon contact plug in the contact hole. In addition, the step of forming a lower electrode metal layer may be preceded by the step of planarizing the barrier metal layer to expose the electrically insulating layer. According to a preferred aspect of the present invention, the step of forming a barrier metal layer is preceded by the step of forming a metal silicide layer in the contact hole to improve the quality of the ohmic contact formed between the barrier metal layer and the contact plug or substrate. Moreover, the step of forming a lower electrode metal layer on the barrier metal layer may be preceded by the step of forming a oxygen diffusion barrier layer comprising a material selected from the group consisting of Ir, Ru, RuO$_2$ and IrO$_2$, on the barrier metal layer. According to another preferred aspect of the present invention, the step of planarizing the lower electrode metal layer comprises exposing the lower electrode metal layer to an N$_2$ gas at a temperature in a range between about 650° C. and 900° C. and for a duration in a range between about 5 minutes and 1 hour.

A number of advantages are achieved when forming a storage electrode of a capacitor according to the present invention. First, the deterioration of the electrical characteristics of a semiconductor device caused by oxygen diffusion through an upper surface of a platinum capacitor electrode and side of an exposed barrier layer can be prevented. In particular, a distance between the surface of the platinum electrode and a critical portion of the barrier layer pattern is maintained at a high level so that oxygen infiltrated through the surface of the platinum electrode and the side of the barrier layer pattern cannot reach the portion of the barrier layer that contacts the substrate or a conductive plug. Second, since an etching mask may be unnecessary to define the lower capacitor electrode, the electrode formed of a platinum group metal can be more easily formed than in the conventional art.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. Like numbers refer to like elements throughout.

Figure 1A:
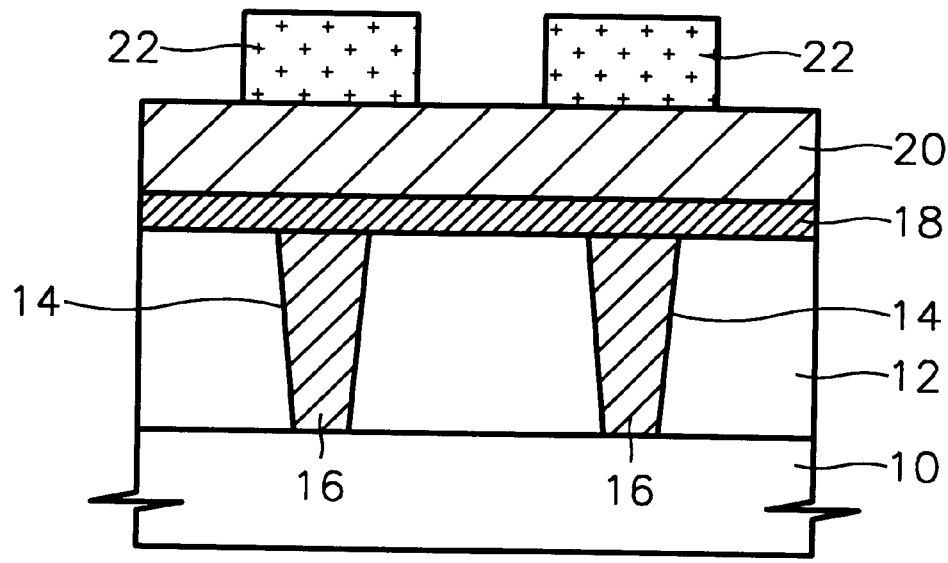
FIGS. 1A–1B are cross-sectional views of intermediate structures that illustrate a method of forming an integrated circuit capacitor according to the prior art.
Figure 1B:
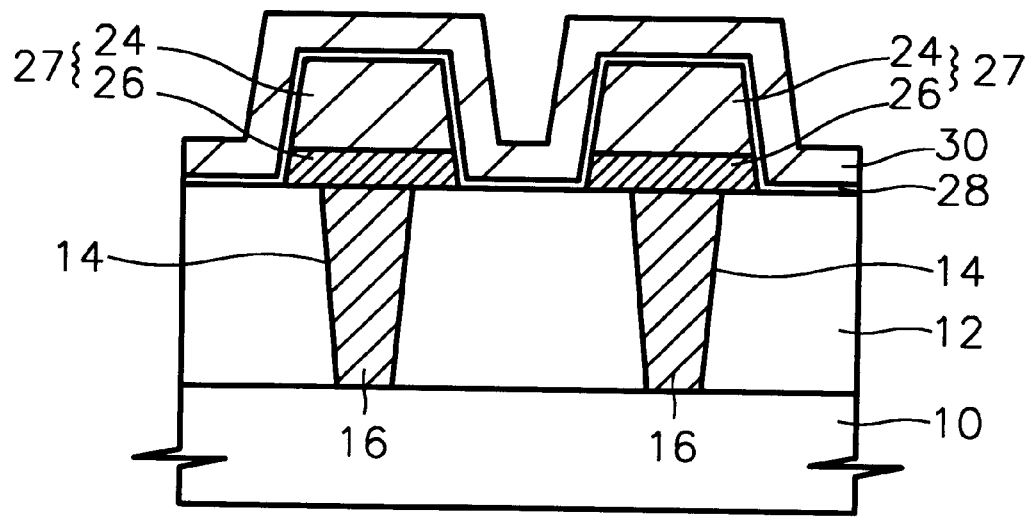
Figure 2A:
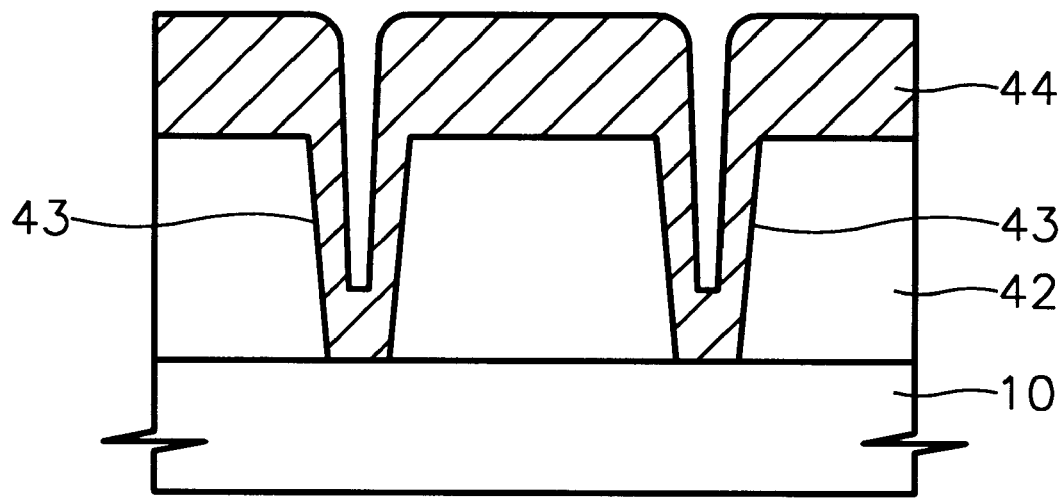
FIGS. 2A–2B are cross-sectional views of intermediate structures that illustrate a method of forming a planarized platinum group metal layer according to an aspect of the present invention.
Figure 2B:
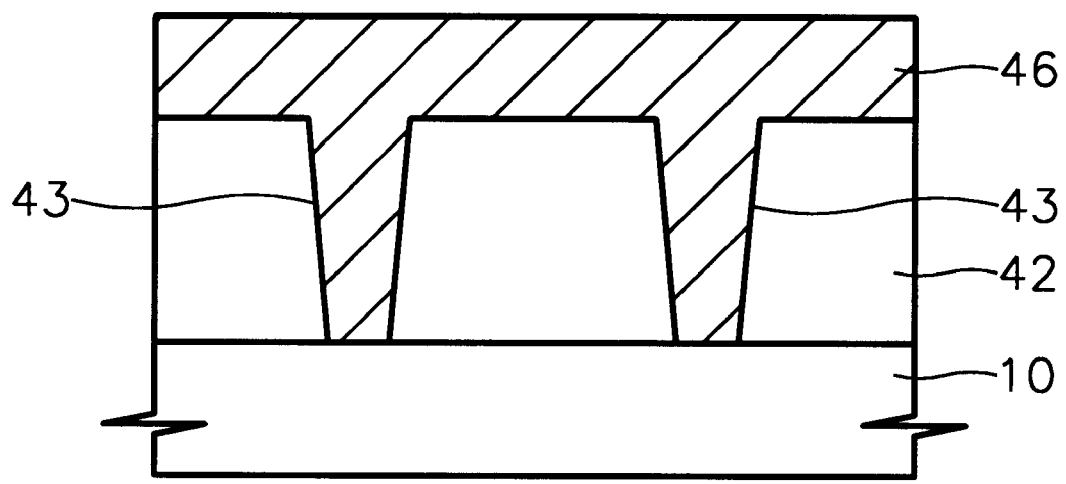

Referring now to FIGS. 2A–2B, a preferred method of forming a platinum group metal layer will be described. FIG. 2A is a sectional view showing the step of forming a platinum layer 44. Here, an insulating layer 42 is formed on a semiconductor substrate 40, and then the insulating layer 42 is partially etched to form an opening 43, and then a metal of the platinum group (e.g., platinum) is deposited on the entire surface of the resultant structure where the opening 43 is formed. Here, a sputtering method may be used to form a platinum layer 44. At this time, the platinum layer 44 is formed to a predetermined thickness (e.g., 1000–2000 Å) and it is also possible to use Ru, Ir, Rh, Os, $RuO_2$ or $IrO_2$ as the platinum group metal.

FIG. 2B is a sectional view showing the step of forming a reflowed platinum layer 46. Here, the structure of FIG. 2A is introduced into a furnace in a typical quartz tube, and then the platinum layer 44 is reflowed to fill the opening 43 and obtain a platinum layer 46 having a planarized surface. Here, it is preferable that the platinum layer 44 be reflowed in a nitrogen ($N_2$) ambient for a duration in a range between about 5 minutes and 1 hour and at a temperature in a range between about 650° C. and 900° C.

Figure 3A:
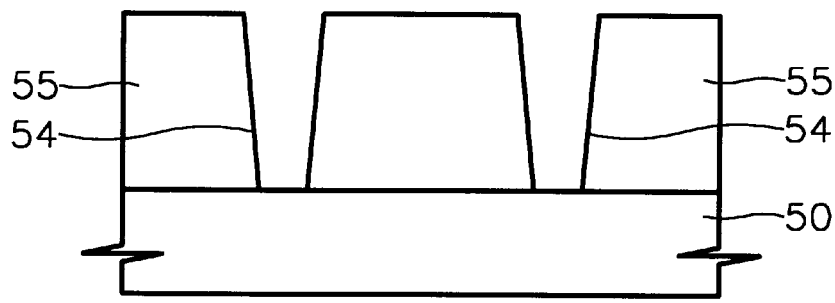
FIGS. 3A–3F are cross-sectional views of intermediate structures that illustrate a method of forming an integrated circuit capacitor according to a first embodiment of the present invention.
Figure 3B:
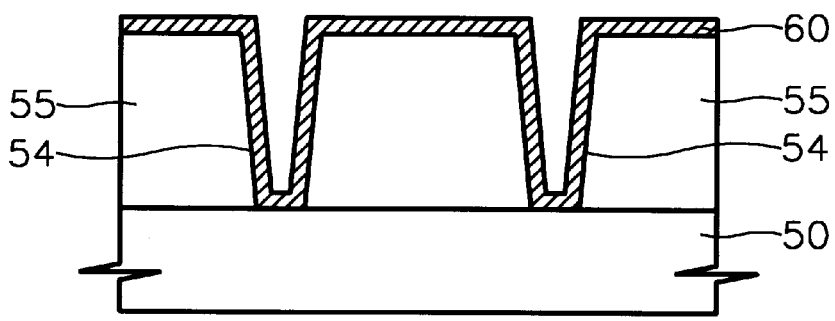

Referring now to FIGS. 3A–3F, a method of forming a capacitor according to a first embodiment of the present invention will be described. Here, FIG. 3A is a sectional view showing a step of forming a storage contact hole 54. An insulating material (e.g., undoped silicate glass (USG)) is deposited on a semiconductor substrate 50 to form an interlayer dielectric 55, and then it is patterned to form a contact hole 54 therein for exposing a predetermined portion of the substrate 50. FIG. 3B is a sectional view showing a step of forming a barrier layer 60. Here, a barrier metal (e.g., titanium nitride) is conformally deposited on the entire surface of the substrate where the storage contact hole 54 is formed, using a chemical vapor deposition method, to form a barrier layer 60. The barrier layer 60 may be formed of a material selected from the group consisting of a refractory metal (e.g., TiN, CiSi, TaSiN, TiSiN, TaSi, TiSi, Ta, TaN), and an oxide of a refractory metal. Meanwhile, before forming the barrier layer 60, it is preferable that a metal silicide layer (e.g., TiSix) is formed on a substrate surface so that an ohmic contact can be reliably made to the silicon substrate to thereby reduce the contact resistance of a storage electrode. The metal silicide layer can be formed by depositing titanium and then annealing it. Instead of titanium, other materials capable of forming a silicide with the silicon substrate (e.g., tungsten nitride (WN) or tungsten (W)) can be used.

Figure 3C:
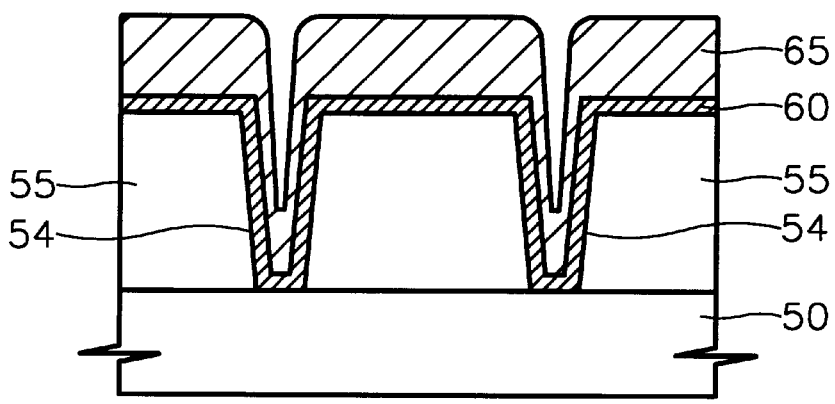

FIG. 3C is a sectional view showing a step of forming a platinum layer 65. Here, a platinum group metal to be used as a storage electrode is deposited on the barrier layer 60 using a sputtering method, to form a platinum layer 65. It is preferable that the platinum layer 65 be formed to a thickness in a range between about 1000 and 2000 Å. Instead of platinum, Ru, Ir, Rh, Os, and oxides thereof can also be used. Before forming the platinum layer 65, an oxygen diffusion barrier layer (not shown) for preventing diffusion of oxygen passing through the platinum layer can be formed between the barrier layer 60 and the platinum layer 65. An Ir, Ru, $RuO_2$, $IrO_2$ or a combined layer thereof can be used for the oxygen diffusion barrier layer.

Figure 3D:
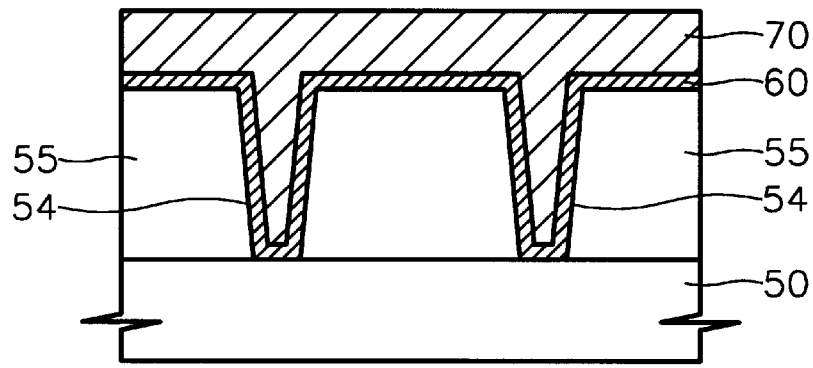

FIG. 3D is a sectional view showing a step of reflowing the platinum layer 65 of FIG. 3C. Here, the resultant structure where the platinum layer 65 is formed is introduced into a quartz tube in a furnace and then the platinum layer 65 is reflowed by heating to fill the storage contact hole 54 and obtain a platinum layer 70 having a planarized surface. The reflowing step is preferably performed in an $N_2$ ambient at a temperature in a range between about 650° C. and 900° C., and for a duration in a range between about 5 minutes and 1 hour.

Figure 3E:
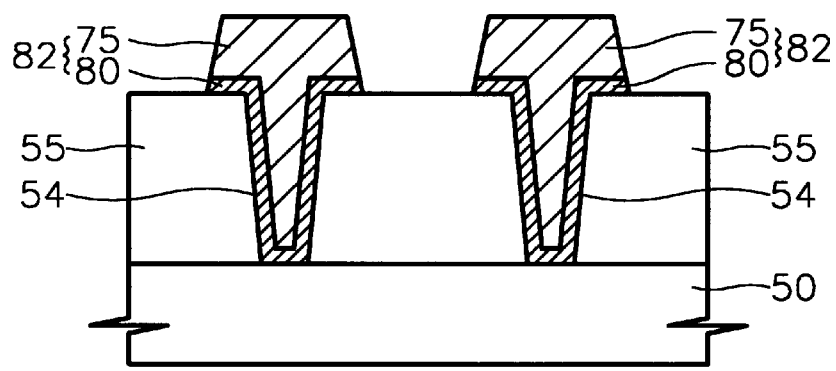

FIG. 3E is a sectional view showing the step of forming a storage electrode 82. Here, an insulating material (e.g., $SiO_2$) is deposited on the planarized platinum layer 70 to a thickness of about 5000 Å or more to form a mask layer. The mask layer is then patterned to form a mask pattern (not shown). Then, the planarized platinum layer 70 and the barrier layer 60 are sequentially etched using the mask pattern as an etching mask, to form the storage electrodes 82 which include the platinum layer pattern 75 and the barrier layer pattern 80. In the above-described storage electrode 82, the increased distance between the barrier layer pattern 80 formed on the bottom surface of the storage contact hole 54 and the surface of the platinum layer pattern 75 can be used advantageously to reduce the likelihood that oxygen will migrate to the portion of the barrier layer pattern 80 in contact with the substrate 50. As a result, oxidation of the barrier layer at the bottom of the contact hole 54 can be inhibited even though the thickness of the platinum layer pattern 75 is maintained at a low level.

Figure 3F:
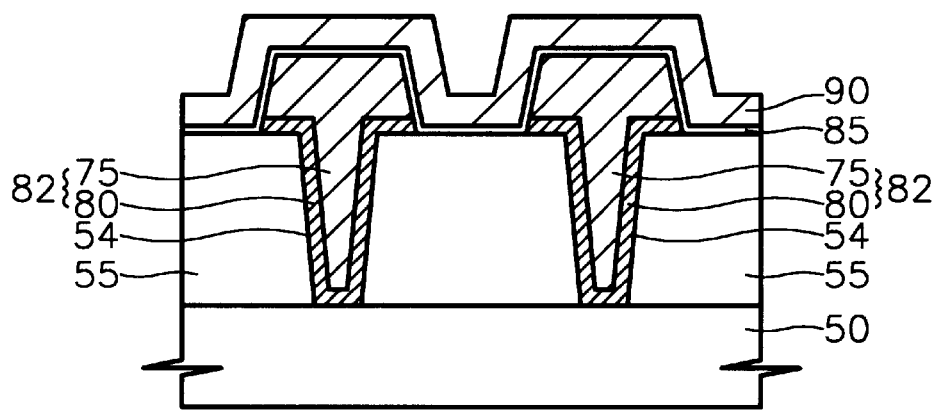

FIG. 3F is a sectional view showing a step of forming a dielectric layer 85 and a plate electrode 90. Here, a dielectric material (e.g., BST) is deposited on the substrate where the storage electrode 82 is formed, using a sputtering method or an MOCVD method, to form the dielectric layer 85. The plate electrode 90 is then formed to complete a capacitor. The dielectric material can also be one selected from the group consisting of $Ta_2O_5$, $SiO_2$, $SiN_3$, $SrTiO_3$, PZT, $SrBi_2Ta_2O_9$, (Pb,La)(Zr,Ti)$0_3$, $Bi_4Ti_3O_{12}$, and combinations thereof.

According to the first embodiment of a preferred method for manufacturing a capacitor without separately forming a conductive plug, a platinum layer is reflowed to fill a storage contact hole. Accordingly, the distance that oxygen must diffuse through a platinum layer pattern 75 and through the side of a barrier layer pattern 80 is increased. This additional distance inhibits reaction between the barrier layer formed on the bottom surface of the storage contact hole and the diffused oxygen. Therefore, oxidation of the barrier layer can be constrained to thereby prevent contact failure of the storage electrode and generation of leakage currents arising from the diffusion of oxygen or metal atoms. As a result, deterioration of the electrical characteristics of a semiconductor device can be inhibited. Also, since the storage electrode 82 can be made relatively thin, patterning can be easily performed and a step difference from adjacent regions around the capacitor can be reduced.

Figure 4A:
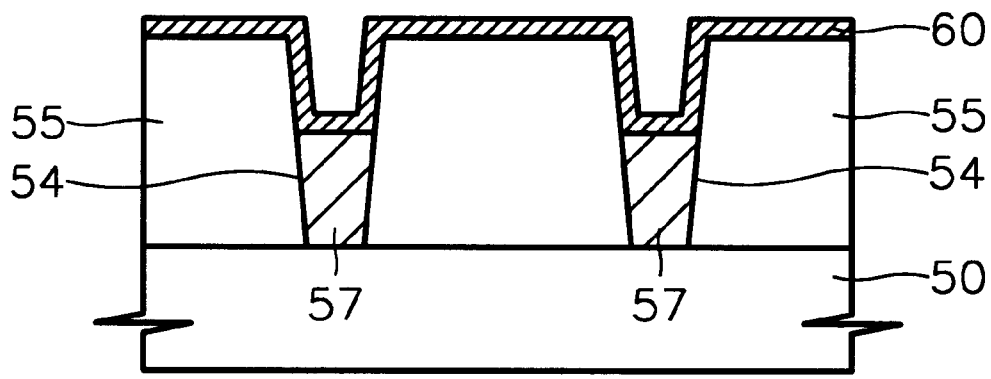
FIGS. 4A–4B are cross-sectional views of intermediate structures that illustrate a method of forming an integrated circuit capacitor according to second embodiment of the present invention.
Figure 4B:
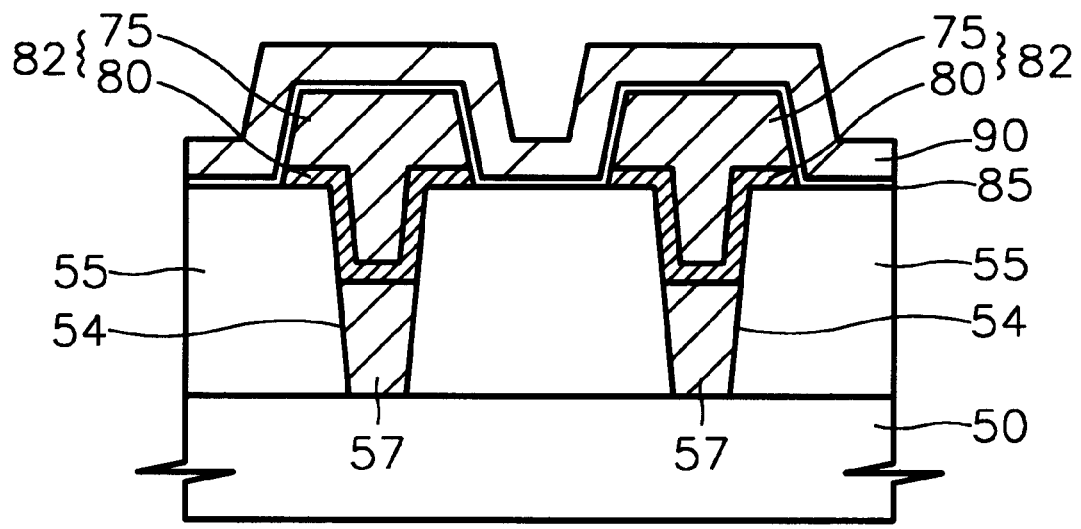

FIGS. 4A and 4B are sectional views for illustrating a second embodiment of a preferred method for manufacturing a capacitor according to the present invention. The second embodiment is similar to the first embodiment, however, a step of forming a conductive plug 57 for filling a portion of the storage contact hole 54 is performed. In particular, FIG. 4A is a sectional view showing a step of forming the conductive plug 57 and the barrier layer 60. Here, the step of patterning an interlayer dielectric 55 to form the storage contact hole 54 (see FIG. 3A) is performed in the same manner as that of the first embodiment. Then, a conductive material (e.g., polysilicon) is deposited on the entire surface of the resultant structure where the storage contact hole 54 is formed, to fill the storage contact hole 54 and form a conductive layer having a predetermined thickness on the interlayer dielectric 55. The conductive layer is then partially eliminated to form a conductive plug 57 for filling a lower portion of the storage contact hole. Then, the barrier layer 60 is formed on the entire surface of the substrate where the conductive plug 57 is formed, in the same manner as the first embodiment. The conductive plug 57 can be formed by eliminating a conductive layer on the interlayer dielectric through an etchback process, and then overetching the conductive layer filling the storage contact hole 54. The conductive layer on the interlayer dielectric 55 may be removed through a CMP process instead of the etchback process, and the etching selectivity of the interlayer dielectric with respect to the conductive layer can be controlled by the removal rate of the CMP process to form the conductive plug 57 filling a portion of the storage contact hole 54.

FIG. 4B is a sectional view showing a step of forming a capacitor formed of a storage electrode 82, a dielectric layer 85, and a plate electrode 90. Here, the storage electrode 82 is formed in the same manner as that shown in FIGS. 3C through 3E, on the resultant structure having the conductive plug 57 therein. Then, the dielectric layer 85 and the plate electrode 90 are formed on the storage electrode 82 to thereby complete a capacitor.

Figure 5A:
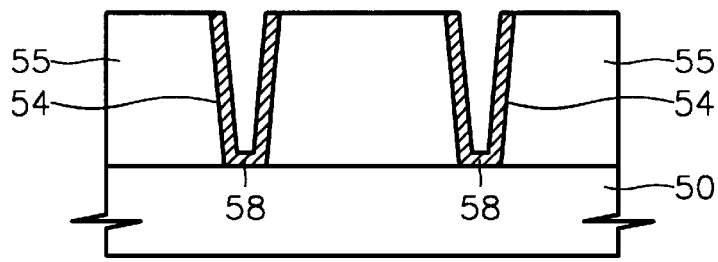
FIGS. 5A–5B are cross-sectional views of intermediate structures that illustrate a method of forming an integrated circuit capacitor according to a third embodiment of the present invention.
Figure 5B:
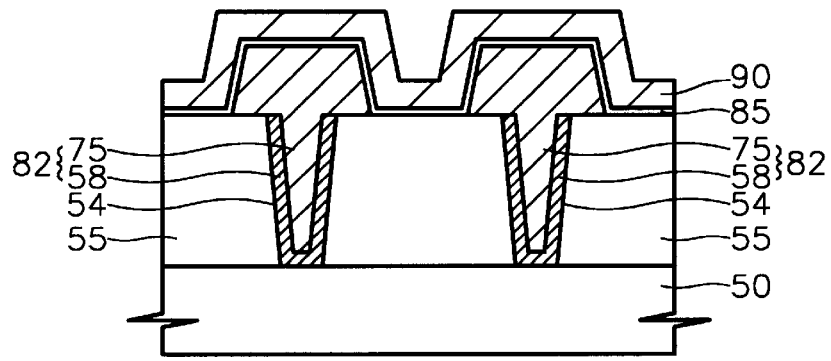

FIGS. 5A and 5B are sectional views for illustrating a third embodiment of a method for manufacturing a capacitor according to the present invention. The third embodiment is performed in a similar manner as that in the first embodiment, but includes a step of removing the barrier layer formed on a region outside the storage contact hole 54 after forming the barrier layer 60 of FIG. 3B. In particular, FIG. 5A is a sectional view showing a step of forming a barrier layer 58. Here, as shown in FIGS. 3A and 3B, the steps for forming the storage contact hole 54 and the barrier layer 60 are performed in the same manner as that of the first embodiment. Then, the barrier layer 60 formed on the interlayer dielectric 55 is removed through a CMP process or an etchback process, to form the barrier layer pattern 58 in the storage contact hole 54. FIG. 5B is a sectional view showing a step of forming a storage electrode 82, a dielectric layer 85 and a plate electrode 90. The storage electrode 82 including a platinum layer pattern 75 and a barrier layer pattern 58, is formed on the resultant structure where the barrier layer pattern 58 is formed, by forming a platinum layer and then reflowing and patterning it in the same manner as in FIGS. 3C through 3E. Then, the dielectric layer 85 and the plate electrode 90 are formed on a substrate where the storage electrode 82 is formed, to complete a capacitor. According to a third embodiment of the present invention, the barrier layer pattern 58 is formed in the storage contact hole, so that a side of the barrier layer pattern is not exposed to oxygen during the step of forming the dielectric layer 85. Therefore, oxidation of the barrier layer can be effectively constrained.

Figure 6A:
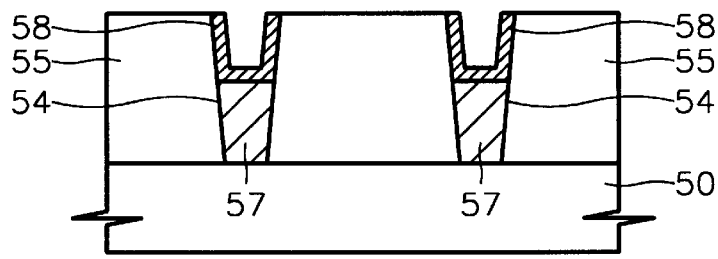
FIGS. 6A–6B are cross-sectional views of intermediate structures that illustrate a method of forming an integrated circuit capacitor according to a fourth embodiment of the present invention.
Figure 6B:
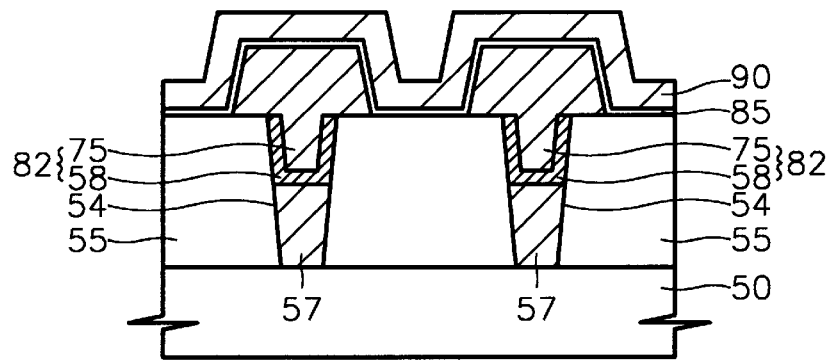

FIGS. 6A and 6B are sectional views for illustrating a fourth embodiment of a method for manufacturing a capacitor according to the present invention. Referring to FIG. 6A, the conductive plug 57 for filling a portion of the storage contact hole is formed like the second embodiment (see FIG. 4A), and then a barrier layer is formed on the entire surface of the substrate where the conductive plug 57 is formed. A portion of the barrier layer formed on the interlayer dielectric 55 is then removed through a CMP process or an etchback process as shown in the third embodiment (see FIG. 5A) to form a barrier layer pattern 58 in the storage contact hole 54. FIG. 6B is a sectional view showing a step of forming a storage electrode 82, a dielectric layer 85 and a plate electrode 90. Here, a capacitor including the storage electrode 82, the dielectric layer 85 and the plate electrode 90 is completed in the same manner as the third embodiment (see FIG. 5B). In the fourth embodiment, the storage contact hole 54 is partially filled with the conductive plug 57. This embodiment is preferred if the aspect ratio of the storage contact hole is high and limits the ability to completely line the contact hole 54 with the barrier layer metal. Further, since the barrier layer pattern 58 is formed only in the storage contact hole, as shown in the third embodiment, the side surfaces of the barrier layer pattern 58 are not exposed directly to oxygen when the dielectric layer is formed.

As described above, in the first through fourth embodiments, platinum is reflowed to form a platinum layer pattern for filling all or a portion of the storage contact hole, to thereby maintain a sufficient distance between the surface of the platinum layer pattern and the barrier layer pattern, or between the surface of the platinum layer pattern and the silicon substrate (or the conductive plug). Accordingly, even though the platinum layer is not thickly formed, the passing of oxygen through the platinum layer to combine with the barrier layer can be inhibited. Also, even though oxygen may infiltrate into the side of the platinum layer, the long diffusion distance inhibits formation of an oxide layer (e.g., a titanium oxide layer) at an interface between the barrier layer pattern and the platinum layer pattern. Meanwhile, it is preferable that a material having an etch rate lower than that of platinum be used as an etching mask for forming a platinum layer pattern. However, since platinum is hard and refractory, it is difficult to obtain a mask having an etch rate lower than that of platinum. However, the platinum layer pattern can be formed using a preferred platinum reflow technique without a mask. This preferred aspect of the present invention will be described in detail with reference to the fifth and sixth embodiments.

Figure 7A:
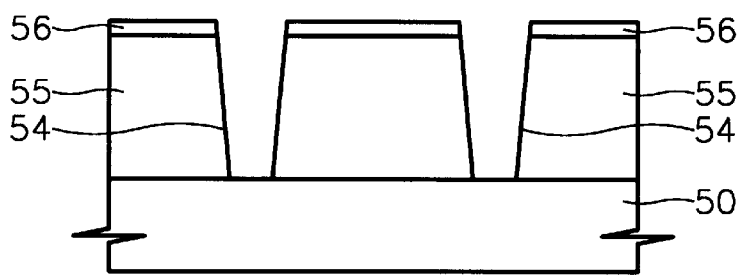
FIGS. 7A–7F are cross-sectional views of intermediate structures that illustrate a method of forming an integrated circuit capacitor according to a fifth embodiment of the present invention.

FIGS. 7A through 7F are sectional views for illustrating a fifth embodiment of a method for manufacturing a capacitor. FIG. 7A is a sectional view showing a step of forming a storage contact hole 54. Here, an insulating material such as undoped silicate glass (USG) or nitride is sequentially deposited on a semiconductor substrate 50 to form an interlayer dielectric 55 and then patterned to form a storage contact hole 54 exposing a predetermined portion of the substrate 50. An etching barrier layer 56 (e.g., $Si_3N_4$) is then formed to prevent the interlayer dielectric 55 from being etched during the step of patterning the etch stopper layer 63 of FIG. 7C. Also, if the etch stopper layer 63 is formed of a material having an etching selectivity higher than that of the interlayer dielectric 55, the etching barrier layer 56 need not be formed.

Figure 7B:
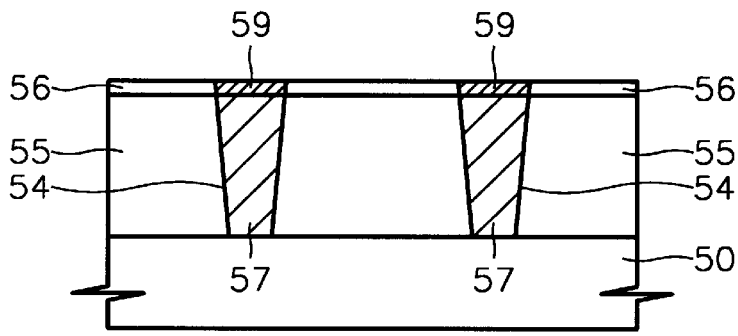

FIG. 7B is a sectional view showing a step of forming a conductive plug 57 and a barrier layer pattern 59. Here, as described in the second embodiment, a conductive material such as doped polysilicon is deposited on the entire surface of the substrate where the storage contact hole 54 is formed, to form a conductive layer for burying the storage contact hole 54. The conductive layer is then planarized through an etchback process or a CMP process, and then the portion of the conductive layer formed in the storage contact hole is partially overetched to form the conductive plug 57. At this time, it is preferable that an overetched depth be equal to the thickness of the barrier layer. Subsequently, a barrier metal such as titanium nitride, is deposited on the entire surface of the substrate where the conductive plug 57 is formed, through a CVD method, and then etched until the etching barrier 56 is exposed to thereby form a barrier layer pattern 59 on the conductive plug 57. A refractory metal can also be used as the barrier metal, and a metal silicide layer for forming an ohmic contact layer can be formed between the barrier layer pattern 59 and the conductive plug 57. Since the barrier layer pattern 59 is formed in the upper end of the storage contact hole opened by overetching the conductive plug 57, the sides of the barrier layer pattern 59 are not exposed.

Figure 7C:
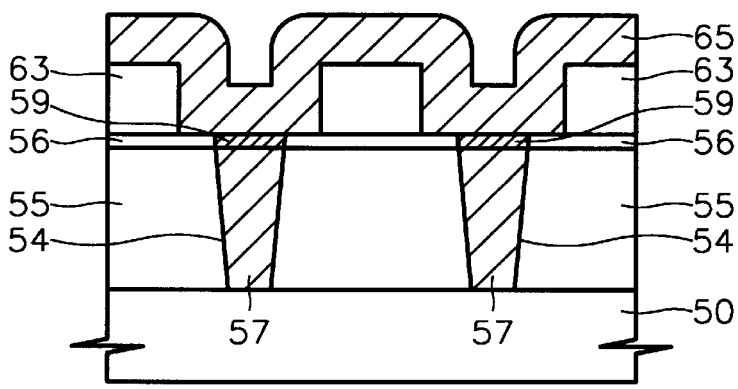

FIG. 7C is a sectional view showing a step of forming an etch stopper 63 and a platinum layer 65. Here, a material having a high wet etching selectivity to platinum (e.g., an oxide) is deposited on the etching barrier layer 56 and the barrier layer pattern 59, and then patterned to form an etch stopper 63 having an opening therein where the storage electrode is to be formed. Then, a platinum group metal to be used as a storage electrode (e.g., platinum) is deposited on the substrate where the etch stopper 63 is formed, to form a platinum layer 65. It is preferable that the platinum layer 65 be formed to a thickness in a range between about 1000 and 2000 Å like the first embodiment and it can be formed using a conventional sputtering method.

Figure 7D:
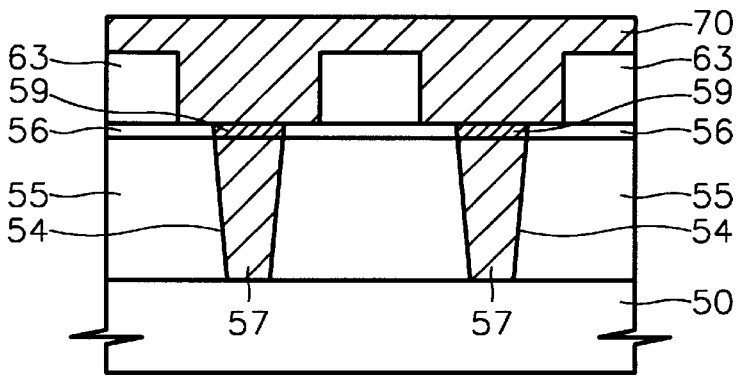
Figure 7E:
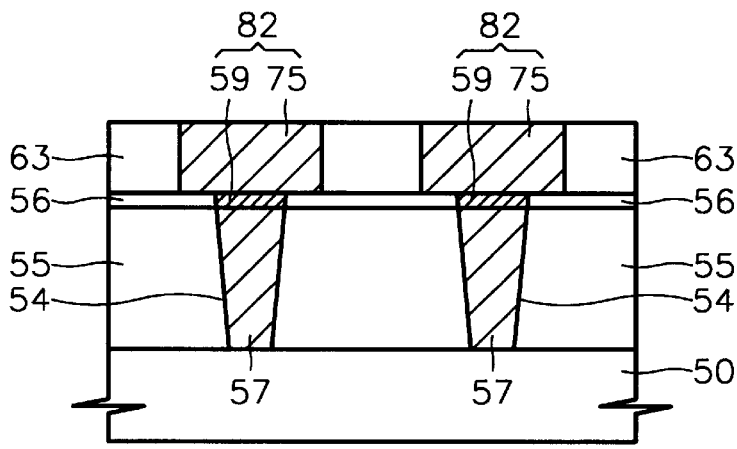

FIG. 7D is a sectional view showing a step of reflowing the platinum layer 65. Here, the platinum layer 65 is reflowed to fill a portion opened by the etch stopper 63 and obtain a platinum layer 70 having a planarized surface. FIG. 7E is a sectional view showing a step of forming a storage electrode 82. Here, the CMP process for the planarized platinum layer 70 is performed until the etch stopper 63 is exposed, to form a platinum layer pattern 75. Accordingly, the storage electrode 82 including the platinum layer pattern 75 and a barrier layer pattern 59 is formed. Thus, as described above, the platinum layer pattern 75 formed through the CMP process does not need to be photolithographically defined by an etchant that selectively etches platinum at a high rate relative to an etchant mask.

Figure 7F:
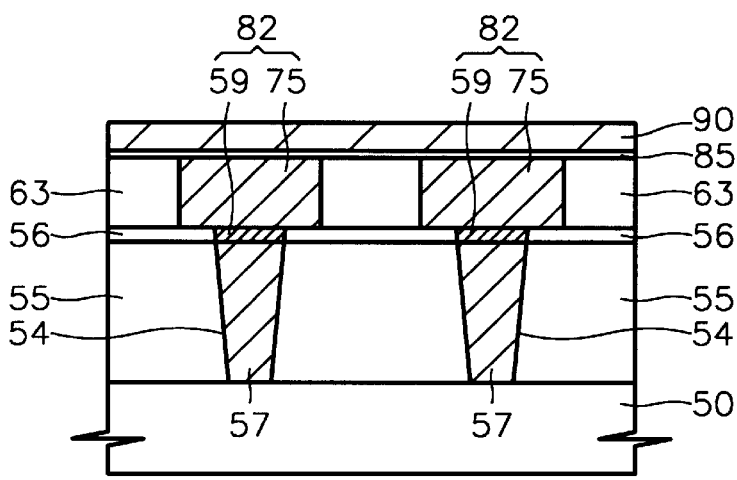

FIG. 7F is a sectional view showing a step of forming a dielectric layer 85 and a plate electrode 90. Here, a dielectric material such as BST or PZT is deposited on the substrate where the storage electrode 82 is formed, using a sputtering method, to form the dielectric layer 85. Subsequently, the plate electrode 90 is formed on the dielectric layer 85 to complete a capacitor. As can be seen in FIG. 7F, since the dielectric layer 85 and the plate electrode 90 are formed in a state that the etch stopper 63 is not removed, only the upper surface area of the storage electrode serves as a capacitor and this reduction in surface area may limit the magnitude of the capacitance of the storage capacitor.

Figure 8:
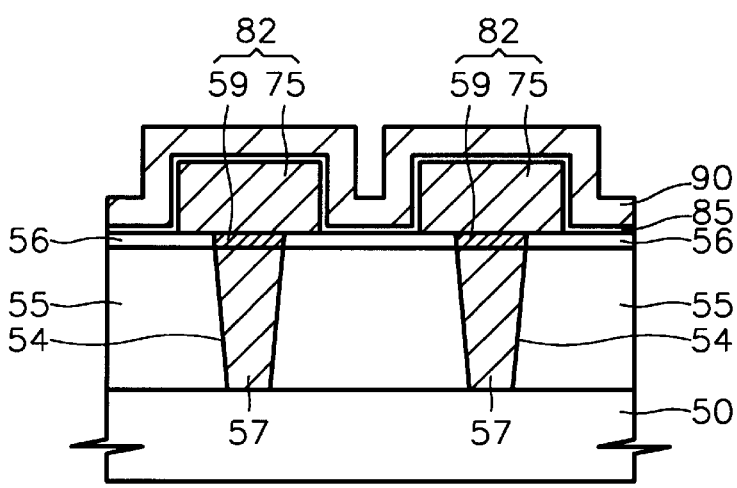
FIG. 8 is a cross-sectional view of an intermediate structure that illustrates in combination with FIGS. 7A–7E, an alternative method of forming an integrated circuit capacitor according to the fifth embodiment of the present invention.

However, as shown in FIG. 8, the etch stopper 63 can be removed using an etchant (e.g., buffered oxide etchant (BOE)) before forming the dielectric layer 85. A dielectric material (e.g., BST or PZT) can then be deposited on the entire surface of the resultant structure through a CVD method to form the dielectric layer 85. Therefore, the total capacitance can be effectively increased due to an increase in the effective area of the storage electrode.

Figure 9A:
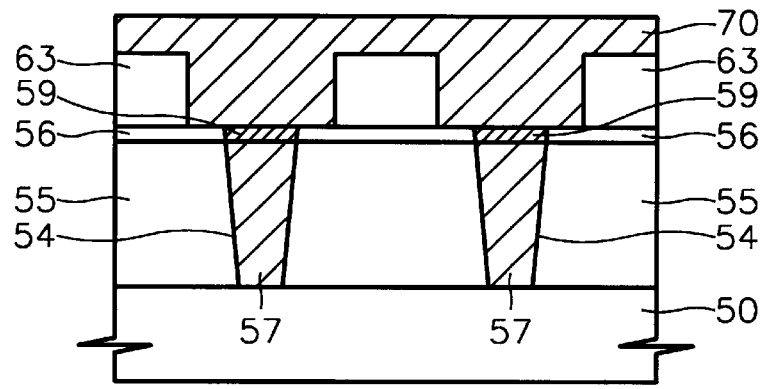
FIGS. 9A–9C are cross-sectional views of intermediate structures that illustrate a method of forming an integrated circuit capacitor according to a sixth embodiment of the present invention.
Figure 9B:
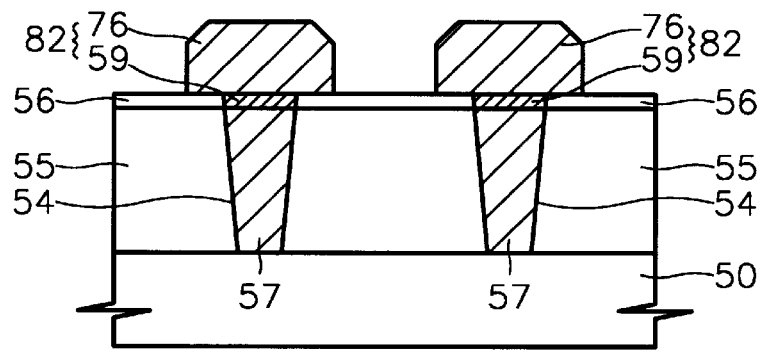

FIGS. 9A through 9B are sectional views for illustrating a sixth embodiment of a method for manufacturing a capacitor. In particular, FIG. 9A shows a step of forming a planarized platinum layer 70. Here, the planarized platinum layer 70 is obtained in the same manner as shown in FIGS. 7A through 7D of the fifth embodiment. FIG. 9B is a sectional view showing a step of forming a platinum layer pattern 76. Here, unlike the fifth embodiment where the platinum layer pattern 75 of FIG. 8E is formed through the CMP method, entire surfaces of the planarized platinum layer pattern 70 and an etch stopper 63 are blanket-etched back. At this time, since the etch rate of the etch stopper 63 formed of an oxide is faster than that of the planarized platinum layer 70, the etchback is performed until the etching barrier layer 56 is exposed, to thereby form the platinum layer pattern 76 having a cut upper edge as shown in FIG. 9B. Accordingly, unlike the fifth embodiment where the etch stopper 63 is removed after the CMP step and then the platinum layer pattern 75 of FIG. 8 is formed, formation of the platinum layer pattern 76 and removal of the etch stopper 63 are carried out by performing a blanket etchback step which leads to a simplification of the manufacturing process.

Figure 9C:
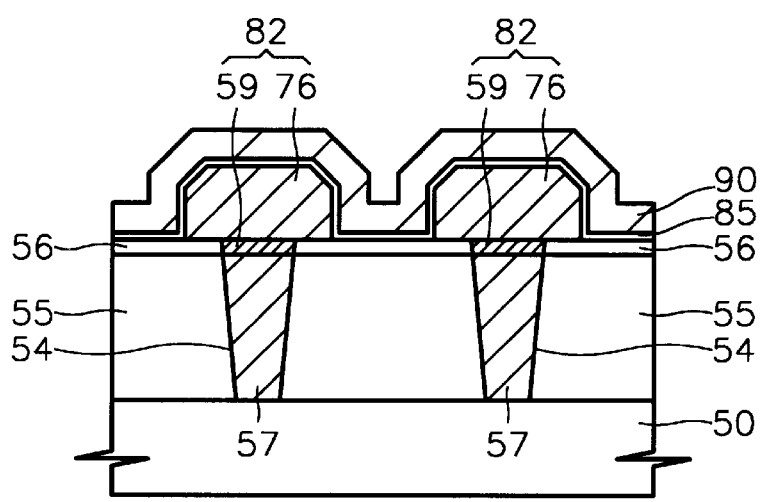

FIG. 9C is a sectional view showing a step of forming a dielectric layer 85 and a plate electrode 90. Here, the dielectric layer 85 and the plate electrode 90 are formed on the storage electrode 82 including the barrier layer pattern 59 and the platinum layer pattern 76, to complete a capacitor. As described above, according to the fifth and sixth embodiments, the etch stopper 63 having an opening portion is formed and then platinum is deposited and reflowed to fill the opening portion of the etch stopper 63, and then the platinum layer pattern is formed by performing the CMP or the etchback process. Accordingly, an etching mask for forming the platinum layer pattern 76 is not necessary. Thus, the platinum layer pattern 76 can be easily formed.

Figure 10A:
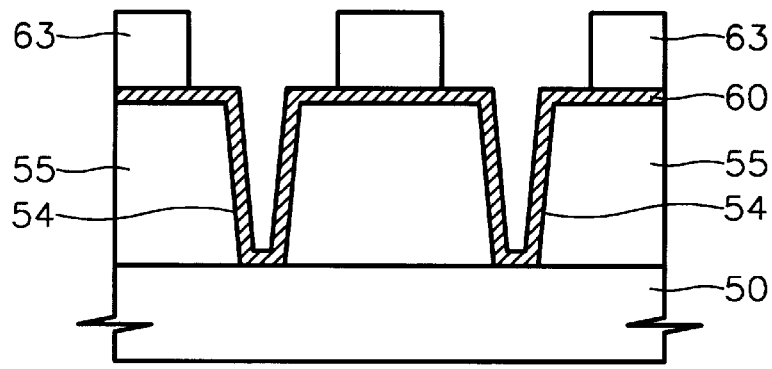
FIGS. 10A–10E are cross-sectional views of intermediate structures that illustrate a method of forming an integrated circuit capacitor according to a seventh embodiment of the present invention.
Figure 10B:
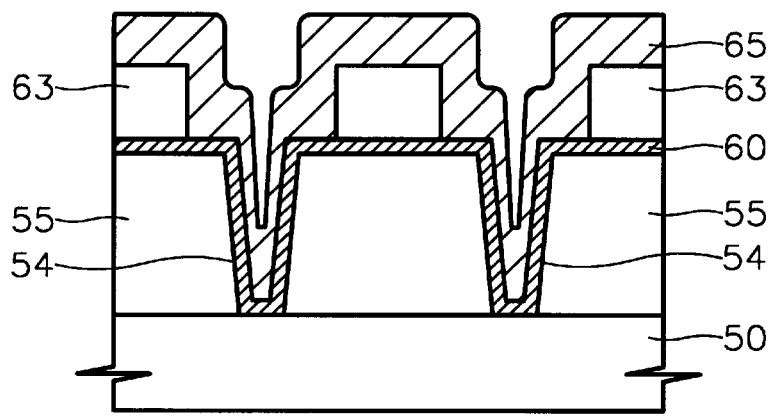
Figure 10C:
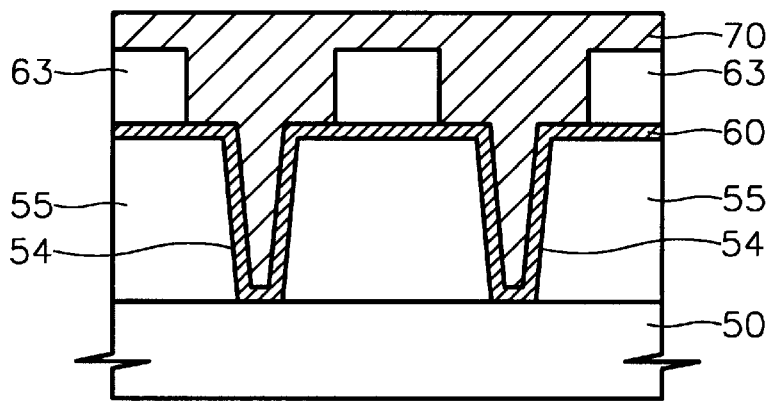

FIGS. 10A through 10F are sectional views for illustrating a seventh embodiment of a preferred method for manufacturing a capacitor. In the seventh embodiment, the barrier layer is formed in the storage contact hole and the platinum layer pattern is formed without an etching mask. FIG. 10A is a sectional view showing a step of forming a barrier layer 60 and an etch stopper 63. Here, the interlayer dielectric 55, the storage contact hole 54 and the barrier layer 60 are formed on the semiconductor substrate 50 and then the etch stopper 63 is formed. FIG. 10B is a sectional view showing a step of forming a platinum layer 65. Here, the platinum layer 65 is formed on the entire surface of the substrate where the etch stopper 63 is formed. FIG. 10C is a sectional view showing a step of forming a planarized platinum layer 70. Here, the platinum layer 65 is reflowed like the first embodiment to bury the storage contact hole 54 and the etch stopper 63.

Figure 10D:
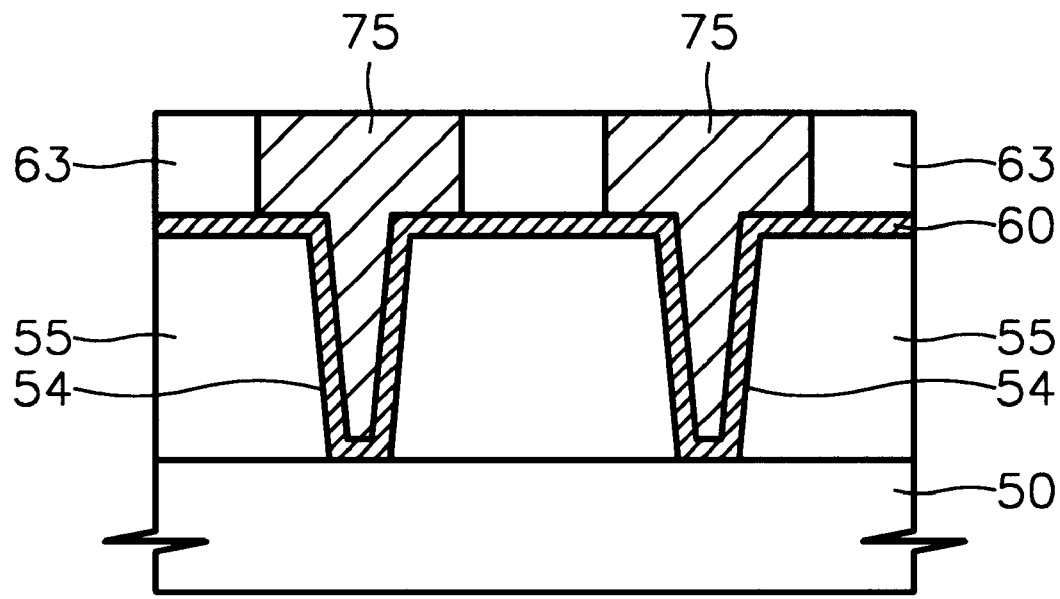
Figure 10E:
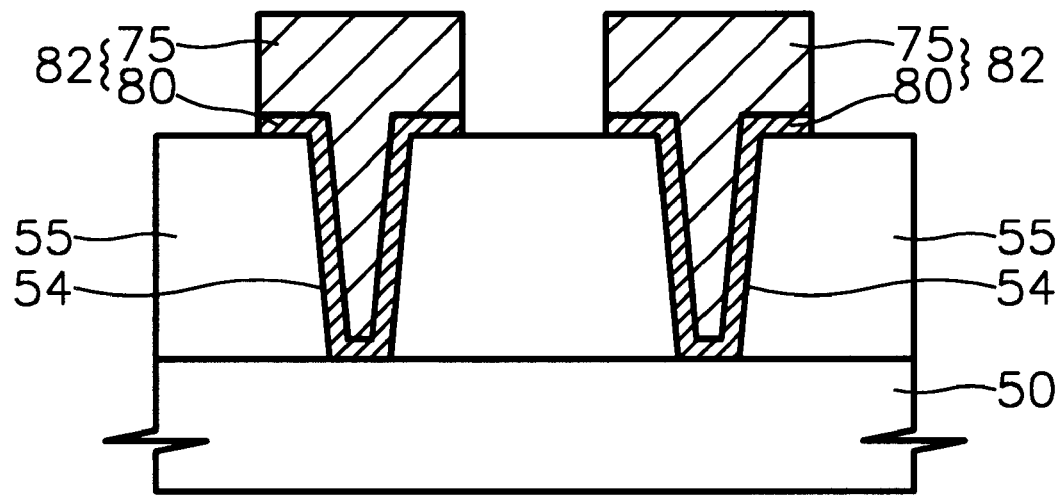

FIG. 10D is a sectional view showing a step of forming a platinum layer pattern 75. Here, a planarization process (e.g., CMP) is performed until the etch stopper 63 is exposed, to form the platinum layer pattern 75. FIG. 10E is a sectional view showing a step of forming a storage electrode 82. Here, the etch stopper 63 of FIG. 10D is removed, and then the barrier layer 60 of FIG. 10D is etched using the platinum layer pattern 75 as an etching mask to form a barrier layer pattern 80. Therefore, the storage electrode 82 including the platinum layer pattern 75 and the barrier layer pattern 80 is formed. Then, a dielectric layer and a plate electrode are formed in the same manner as that of the first embodiment. The storage electrode 82 in the seventh embodiment has the same structure as that of the first embodiment. Accordingly, like in the first embodiment, during the step of forming the dielectric layer, the a distance that oxygen must diffuse from the surface of the platinum layer pattern 75 and from the side of the barrier layer pattern 80 is long, and thus contact failure of the storage electrode can be prevented. Also, like in the fifth embodiment, the platinum layer pattern 75 can be formed without an etching mask.

Figure 11A:
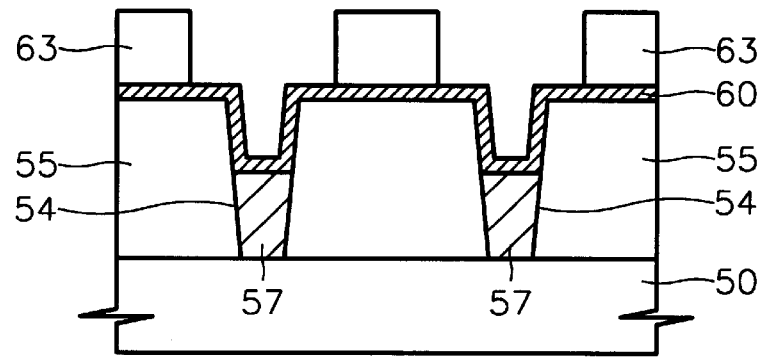
FIGS. 11A–11C are cross-sectional views of intermediate structures that illustrate a method of forming an integrated circuit capacitor according to a eighth embodiment of the present invention.
Figure 11B:
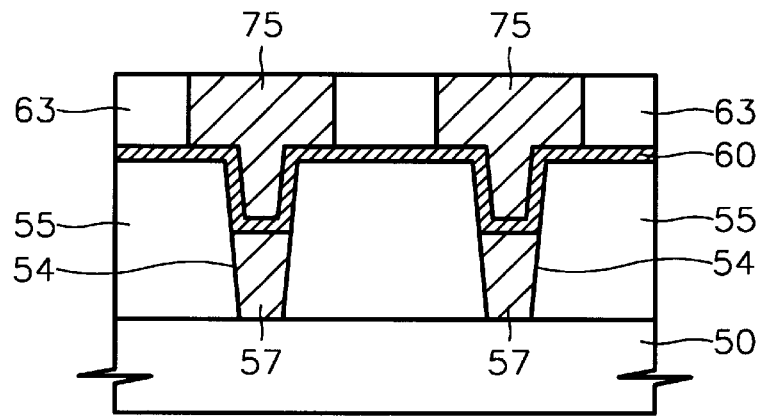
Figure 11C:
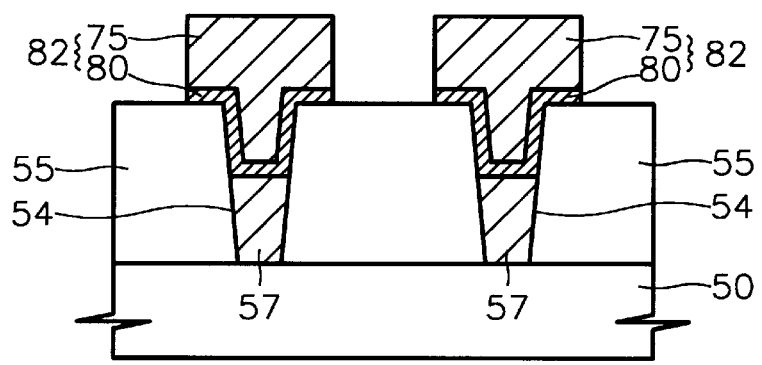

FIGS. 11A through 11C are sectional views for illustrating an eighth embodiment of a method for manufacturing a capacitor. According to the eighth embodiment, as shown in FIG. 11A, the conductive plug 57 for filling a portion of the storage contact hole 54 and the barrier layer 60 are formed in the same manner as that of the second embodiment, and then an etch stopper 63 is formed to have openings therein where the storage electrode is to be formed. Subsequently, like the seventh embodiment, a platinum layer pattern 75 is formed as shown in FIGS. 11B and 11C and then the etch stopper 63 is removed and then a storage electrode 82 including the platinum layer pattern 75 and the barrier layer pattern 80 is formed.

Figure 12A:
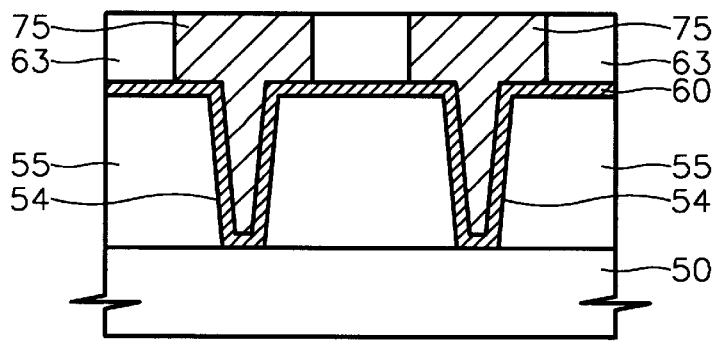
FIGS. 12A–12C are cross-sectional views of intermediate structures that illustrate a method of forming an integrated circuit capacitor according to a ninth embodiment of the present invention.
Figure 12B:
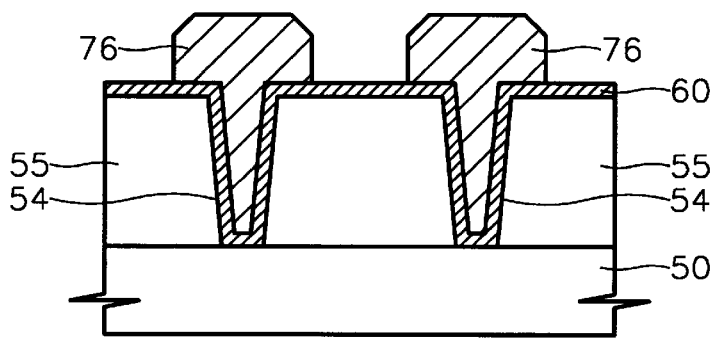
Figure 12C:
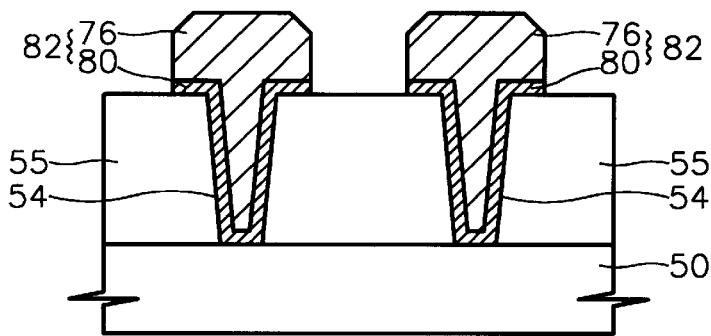

FIGS. 12A through 12C are sectional views for illustrating a ninth embodiment of a method for manufacturing a capacitor. As shown in FIG. 12A, the steps for forming the planarized platinum layer 75 are performed in the same manner as shown in the seventh embodiment, and then the planarized platinum layer 75 and the etch stopper 63 are blanket-etched back as in the sixth embodiment (see FIG. 9B), to form a platinum layer pattern 76 having cut upper edges as illustrated by FIG. 12B. Subsequently, as shown in FIG. 12C, the barrier layer 60 is etched using the platinum layer pattern 76 as a mask, to form a storage electrode 82 including the platinum layer pattern 76 and the barrier layer pattern 80.

Figure 13:
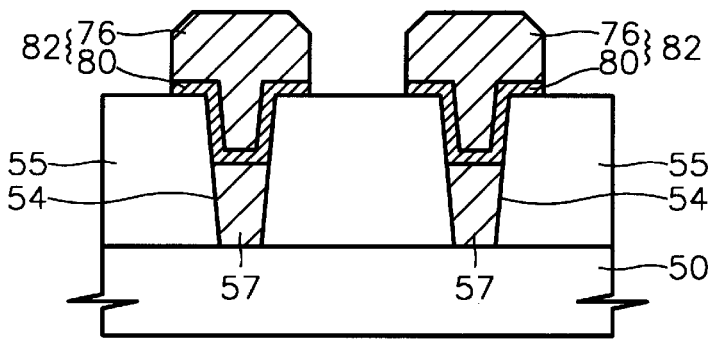
FIG. 13 is a cross-sectional view of an intermediate structure that illustrates a method of forming an integrated circuit capacitor according to a tenth embodiment of the present invention.

FIG. 13 is a sectional view for illustrating a tenth embodiment of the present invention. The tenth embodiment is the same as the ninth embodiment except for the step of forming a conductive plug 57 for filling a portion of the storage contact hole 54.

Figure 14:
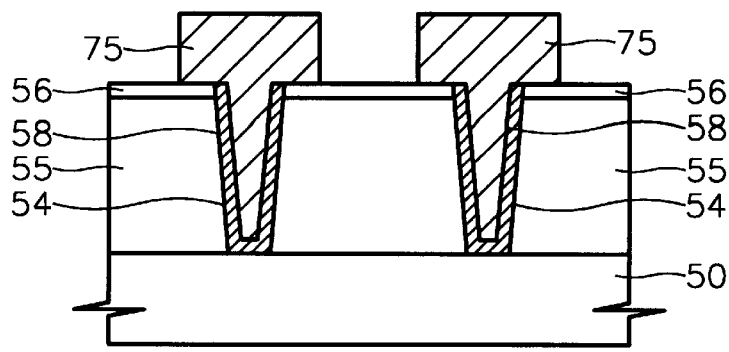
FIG. 14 is a cross-sectional view of an intermediate structure that illustrates a method of forming an integrated circuit capacitor according to an eleventh embodiment of the present invention.

FIG. 14 is a sectional view for illustrating an eleventh embodiment of the present invention. Referring to FIG. 14, the barrier layer pattern 58 in the storage contact hole is formed, and an etch stopper 63 of FIG. 10D and a platinum layer pattern 75 are formed on the resultant structure where the barrier layer pattern 58 is formed. The etch stopper is removed in the same manner as that of the seventh embodiment (see FIGS. 10A through 10D). At this time, it is preferable that an etching barrier layer 56 for preventing the interlayer dielectric 55 from being etched is formed, however, it may not be necessary in the event the etch stopper is formed of a material having a high etching selectivity with respect to the interlayer dielectric 55 (i.e., can be etched at a significantly higher rate than the interlayer dielectric 55).

Figure 15:
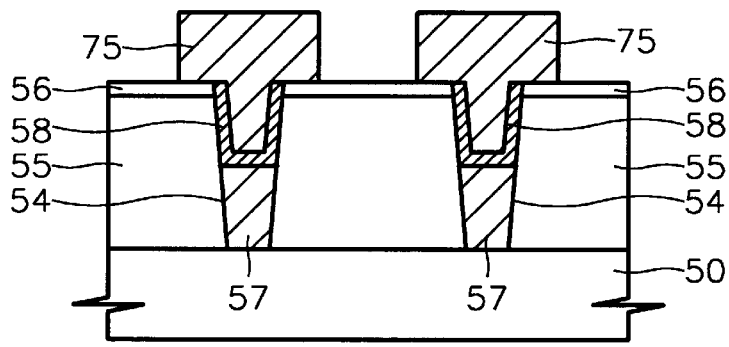
FIG. 15 is a cross-sectional view of an intermediate structure that illustrates a method of forming an integrated circuit capacitor according to a twelfth embodiment of the present invention.

FIG. 15 is a sectional view for illustrating a twelfth embodiment of the present invention. The twelfth embodiment is the same as the eleventh embodiment except for the step of forming the conductive plug 57 by filling a portion of the storage contact hole 54, as shown in FIG. 15.

Figure 16:
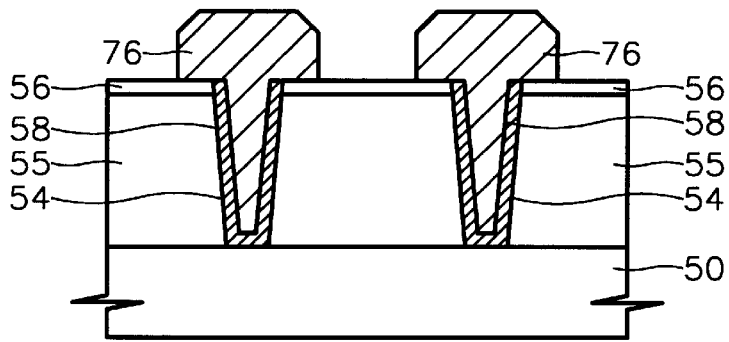
FIG. 16 is a cross-sectional view of an intermediate structure that illustrates a method of forming an integrated circuit capacitor according to a thirteenth embodiment of the present invention.

FIG. 16 is a sectional view for illustrating a thirteenth embodiment of the present invention. The thirteenth embodiment is the same as the eleventh embodiment except for the step of forming the platinum layer pattern 76 having slantingly cut edges by performing an etchback step, as shown in FIG. 16.

Figure 17:
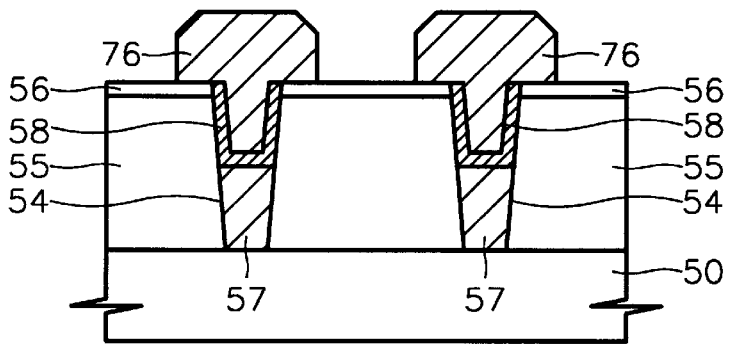
FIG. 17 is a cross-sectional view of an intermediate structure that illustrates a method of forming an integrated circuit capacitor according to a fourteenth embodiment of the present invention.

FIG. 17 is a sectional view for illustrating a fourteenth embodiment of the present invention. The fourteenth embodiment is the same as the thirteenth embodiment except for the step of forming a conductive plug 57 filling a portion of the storage contact hole 54.

A number of advantages are achieved when forming a storage electrode of a capacitor according to the present invention. First, the deterioration of the electrical characteristics of a semiconductor device caused by oxygen diffusion through an upper surface of a platinum capacitor electrode and side of an exposed barrier layer can be prevented. In particular, a distance between the surface of the platinum electrode and the barrier layer pattern is maintained at a high level so that oxygen infiltrated through the surface of the platinum electrode and the side of the barrier layer pattern cannot reach the portion of the barrier layer that contacts the substrate or a conductive plug. Second, since an etching mask is typically unnecessary, the electrode formed of a platinum group metal can be more easily formed than in the conventional art.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit capacitor, comprising the steps of:

forming an electrically insulating layer on a face of a semiconductor substrate;

patterning the electrically insulating layer to define a contact hole therein;

forming a barrier metal layer in at least a portion of the contact hole;

forming a lower electrode metal layer on the barrier metal layer;

planarizing the lower electrode metal layer by reflowing the lower electrode metal layer at a temperature greater than about 650° C.;

patterning the planarized lower electrode metal layer to define a lower capacitor electrode;

forming a dielectric layer on the lower capacitor electrode; and forming an upper capacitor electrode on the dielectric layer, opposite the lower capacitor electrode.

2. The method of claim 1, wherein said step of patterning the electrically insulating layer comprises patterning the electrically insulating layer to define a contact hole therein that exposes the face of the semiconductor substrate; and wherein said step of forming a barrier metal layer comprises depositing a conformal barrier metal layer on sidewalls of the contact hole.

3. The method of claim 2, wherein the barrier metal layer is selected from the group consisting of TiN, CoSi, TaSiN, TiSiN, TaSi, TiSi, Ta and TaN.

4. The method of claim 2, wherein said step of forming a barrier metal layer comprises depositing a conformal barrier metal layer on sidewalls of the contact hole and in contact with the exposed face of the semiconductor substrate.

5. The method of claim 2, wherein said step of forming a barrier metal is preceded by the step of forming a polysilicon contact plug in the contact hole.

6. The method of claim 4, wherein said step of forming a lower electrode metal layer is preceded by the step of planarizing the barrier metal layer to expose the electrically insulating layer.

7. The method of claim 5, wherein said step of forming a lower electrode metal layer is preceded by the step of planarizing the barrier metal layer to expose the electrically insulating layer.

8. The method of claim 3, wherein the dielectric layer comprises a material selected from the group consisting of $Ba(Sr, Ti)O_3$, $Pb(Zr, Ti)O_3$, $Ta_2O_{5, SiO2}$, $SiN_3$, $SrTiO_3$, PZT, $SrBi_2Ta_2O_9$, $(Pb, La)(Zr, Ti)O_3$ and $Bi_4Ti_3O_{12}$.

9. The method of claim 1, wherein said step of forming a barrier metal layer is preceded by the step of forming a metal silicide layer in the contact hole.

10. The method of claim 9, wherein said step of forming a lower electrode metal layer on the barrier metal layer is preceded by the step of forming a oxygen diffusion barrier layer comprising a material selected from the group consisting of Ir, Ru, $RuO_2$ and $IrO_2$, on the barrier metal layer.

11. The method of claim 10, wherein said step of planarizing the lower electrode metal layer comprises exposing the lower electrode metal layer to an $N_2$ gas at a temperature in a range between about 650° C. and 900° C. and for a duration in a range between about 5 minutes and 1 hour.

12. A method of forming an integrated circuit capacitor, comprising the steps of:

forming an electrically insulating layer on a face of a semiconductor substrate;

forming an etch barrier layer on the electrically insulating layer;

patterning the etch barrier layer and electrically insulating layer to define a contact hole therein;

forming an electrically conductive plug in the contact hole;

depositing a barrier metal layer on the etch barrier layer and in the contact hole;

etching the deposited barrier metal layer to expose the etch barrier layer and define a barrier metal plug on the electrically conductive plug;

forming an etch stopper layer on the etch barrier layer;

patterning the etch stopper layer to define an opening therein extending opposite the barrier metal plug;

forming a lower electrode metal layer on the patterned etch stopper layer and on the barrier metal plug;

planarizing the lower electrode metal layer by reflowing the lower electrode metal layer at a temperature greater than about 650° C;

etching the planarized lower electrode metal layer to define a lower capacitor electrode;

forming a dielectric layer on the lower capacitor electrode; and forming an upper capacitor electrode on the dielectric layer, opposite the lower capacitor electrode.

13. The method of claim 12, wherein said step of forming a dielectric layer is preceded by the step of removing the patterned etch stopper layer to expose the etch barrier layer.

14. The method of claim 13, wherein said step of forming a dielectric layer comprises depositing a dielectric layer on the lower capacitor electrode and on the etch barrier layer.

15. A method of forming an integrated circuit capacitor, comprising the steps of:

forming an electrically insulating layer on a face of a semiconductor substrate;

patterning the electrically insulating layer to define a contact hole therein which exposes a portion of the face;

lining the contact hole with a barrier metal layer;

forming an etch stopper layer on the electrically insulating layer;

patterning the etch stopper layer to define an opening therein extending opposite the contact hole;

forming a lower electrode metal layer on the patterned etch stopper layer and in the opening therein;

planarizing the lower electrode metal layer by reflowing the lower electrode metal layer at a temperature greater than about 650° C., to fill the contact hole;

etching the planarized lower electrode metal layer to define a lower capacitor electrode and expose the patterned etch stopper layer;

removing the patterned etch stopper layer;

etching the barrier metal layer, using the lower capacitor electrode as an etching mask;

forming a dielectric layer on the lower capacitor electrode; and forming an upper capacitor electrode on the dielectric layer, opposite the lower capacitor electrode.

16. The method of claim 15, wherein said step of lining the contact hole is preceded by the step of forming a polysilicon plug in the contact hole.

17. The method of claim 15, wherein said step of lining the contact hole comprises lining the exposed portion of the face with the barrier metal layer.

* * * * *